US007795714B2

(12) United States Patent
Hiew et al.

(10) Patent No.: US 7,795,714 B2
(45) Date of Patent: *Sep. 14, 2010

(54) TWO STEP MOLDING PROCESS SECURED DIGITAL CARD MANUFACTURING METHOD AND APPARATUS

(75) Inventors: Siew Sin Hiew, San Jose, CA (US); Nan Nan, San Jose, CA (US); Abraham Chih-Kang Ma, Fremont, CA (US); Paul Hsueh, Concord, CA (US)

(73) Assignee: SuperTalent Electronics, Inc., San Jose, CA (US)

( * ) Notice: Subject to any disclaimer, the term of this patent is extended or adjusted under 35 U.S.C. 154(b) by 633 days.

This patent is subject to a terminal disclaimer.

(21) Appl. No.: 11/744,125

(22) Filed: May 3, 2007

(65) Prior Publication Data

US 2008/0011860 A1   Jan. 17, 2008

Related U.S. Application Data

(63) Continuation-in-part of application No. 11/744,119, filed on May 3, 2007, and a continuation-in-part of application No. 10/913,868, filed on Aug. 6, 2004, now Pat. No. 7,264,992.

(51) Int. Cl.
*H01L 23/02* (2006.01)
*H05K 1/14* (2006.01)
*G06K 19/06* (2006.01)

(52) U.S. Cl. ............... 257/679; 257/678; 361/737; 235/492

(58) Field of Classification Search ............... 257/678, 257/679; 361/737; 235/492
See application file for complete search history.

(56) References Cited

U.S. PATENT DOCUMENTS

| | | | | |
|---|---|---|---|---|
| 6,381,143 | B1 * | 4/2002 | Nakamura | 361/737 |
| 6,580,615 | B1 * | 6/2003 | Nakanishi et al. | 361/737 |
| 6,590,778 | B1 * | 7/2003 | Hojo et al. | 361/737 |
| 6,632,997 | B2 * | 10/2003 | Hoffman et al. | 174/527 |
| 6,910,635 | B1 * | 6/2005 | Miks et al. | 235/487 |
| 7,120,029 | B2 * | 10/2006 | Nishizawa et al. | 361/737 |
| 7,407,393 | B2 | 8/2008 | Ni et al. | |
| 7,420,803 | B2 | 9/2008 | Hsueh et al. | |

* cited by examiner

*Primary Examiner*—Luan C Thai
(74) *Attorney, Agent, or Firm*—Maryam Imam; IPxLaw Group LLP (57) ABSTRACT

A molded secured digital (SD) card having a bottom plastic piece having a plurality of lateral sides, said bottom plastic piece further having a cavity interposed along said plurality of lateral sides, in accordance with an embodiment of the present invention. The molded SD card further having a printed circuit board (PCB) assembly positioned in said cavity, one of said plurality of lateral sides of said bottom plastic piece having a notch recess, said molded SD card further having a male guide insertably positioned into said notch recess, said molded SD card further having a female switch clamped onto said male guide to form a write-protect switch.

17 Claims, 11 Drawing Sheets

TWO STEP MOLDING PROCESS SECURED DIGITAL CARD MANUFACTURING METHOD AND APPARATUS

CROSS REFERENCE TO RELATED APPLICATIONS

This application is a continuation-in-part of U.S. patent application Ser. No. 11/744,119, filed on May 3, 2007, entitled "SEAMLESS SECURED DIGITAL CARD MAUFACTURING METHODS WITH MALE GUIDE AND FEMALE SWITCH" and is a continuation-in-part of U.S. patent application Ser. No. 10/913,868, filed on Aug. 6, 2004, now U.S. Pat. No. 7,264,992 and entitled "REMOVABLE FLASH INTEGRATED MEMORY MODULE CARD AND METHOD OF MANUFACTURE" which are incorporated herein by reference as though set forth in full.

BACKGROUND OF THE INVENTION

1. Field of the Invention

The present invention relates generally to the field of chip on board (COB) secured digital (SD) cards and particularly to a method and apparatus for manufacturing chip on board SD cards with write-protect switch.

2. Description of the Prior Art

As computers have gained enormous popularity in recent decades, so has the need for better and more efficient ways of storing memory. Notable among memory devices are the portable ones that may be carried around by the user to access computers at different locations. This is particularly common in the case of personal computers (PC) where the need often arises to transfer data from one PC to another. Examples of portable memory devices include nonvolatile memory devices such as a secured digital (SD) card that is removably connectible to a computer.

Secured digital cards are available in various shapes and forms. The SD card is coupled to a host device such as a PC for storage and retrieval of data. To protect the data stored in the memory of the card in some cases a write-protect switch is available which may be activated to allow writing of information onto the memory.

However, the conventional SD cards with a write-protect switch are generally expensive to manufacture and the packaging thereof may not have the desired reliability. For example, the card may not be water and moisture resistant enough to be used in different environments.

Thus, it is desirable to manufacture an SD card with high reliability and improved resistance against water and moisture. In addition, the SD card should have a low cost of manufacturing with an improved esthetic quality to appeal to a wide range of potential users.

SUMMARY OF THE INVENTION

Briefly, an embodiment of the present invention includes a molded secured digital (SD) card having a bottom plastic piece having a plurality of lateral sides, said bottom plastic piece further having a cavity interposed along said plurality of lateral sides. The molded SD card further having a printed circuit board (PCB) assembly positioned in said cavity, one of said plurality of lateral sides of said bottom plastic piece having a notch recess, said molded SD card further having a male guide insertably positioned into said notch recess, said molded SD card further having a female switch clamped onto said male guide to form a write-protect switch.

The foregoing and other objects, features and advantages of the present invention will be apparent from the following detailed description of the preferred embodiments which make reference to several figures of the drawing.

DETAILED DESCRIPTION OF THE PREFERRED EMBODIMENTS

Figure 1:
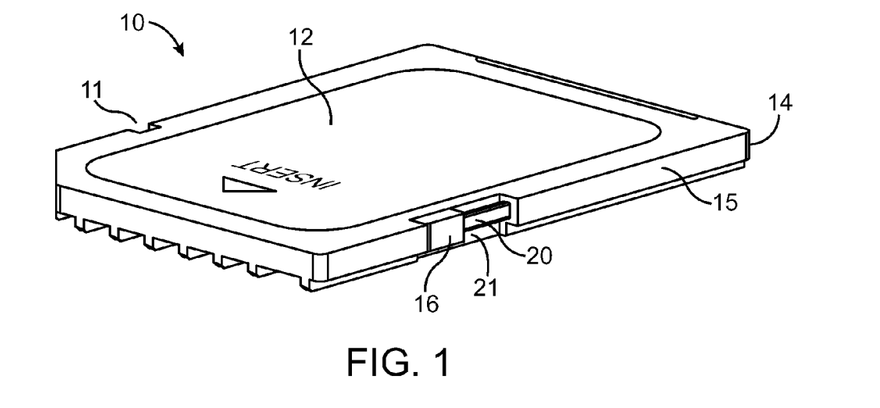
FIG. 1 shows an overall view of a molded secured digital (SD) card 10, in accordance with an embodiment of the present invention.

Referring now to FIG. 1, an overall view of a molded secured digital (SD) card 10 is shown to include a bottom plastic piece 14, a label 12, a male guide 20 and a female switch 16, in accordance with an embodiment of the present invention. The molded SD card is used to store and retrieve information. Once coupled to a host device, information is transferred therebetween to be either stored in or retrieved from the molded SD card 10. The label 12 is positioned on top of the bottom plastic piece 14. As shown in the embodiment of FIG. 1, the bottom plastic piece 14 has a plurality of lateral sides one of which is the lateral side 15. The lateral side 15 includes a recess notch 21 wherein the male guide 20 is inserted. The female switch 16 is clamped on the male guide 20 to form a write-protect switch for the molded SD card 10.

The purpose of the male guide 20 and female switch 16 is to provide write-protect capability to the molded SD card 10 which protects the information stored therein from being overwritten. Specifically, the female switch 16 can slide over the male guide 20 to assume two positions whereby the female switch 16 comes in contact with each of the two inner sides of the recess notch 21. The first of the two positions is the write-protect position where information cannot be written onto the memory unit of the molded SD card 10. The second position is the read/write position where information may be written into the memory unit of the card 10. The position of the female switch 16 determines either of the two positions. The position of the female switch 16 in FIG. 1 corresponds to the second position.

One of the advantages of the molded SD card 10 is in providing resistance to moisture and water while at the same time having a considerably low cost of manufacturing.

Printed on the label 12 is the company's custom designed logo and information which is attached to the top surface of the molded SD card 10. The label 12 has an adhesive layer on the backside for attachment to the top surface of the molded SD card 10. In addition, the label 12 serves the purpose of concealing the interfaces on the top surface of the molded SD card 10 to enhance esthetic value thereof, as described in more detail hereinbelow. Also shown in FIG. 1 is slot 11 for securing the molded SD card 10 to a host device to prevent the molded SD card 10 from slipping out of the host device due to gravity, vibration or other causes.

Figure 2:
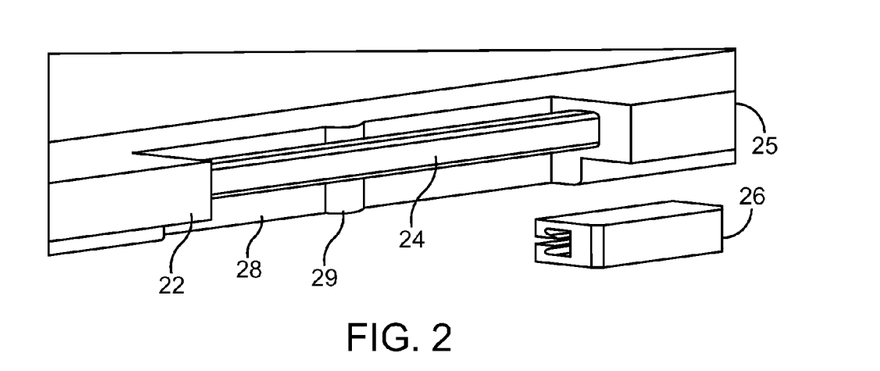
FIG. 2 shows a close up view of the male guide and female switch components, in accordance with an embodiment of the present invention.

Referring now to FIG. 2, a close up view of the male guide and female switch components are shown to include a bottom plastic piece 25, a male guide 24, a female switch 26 and a top cover 27, in accordance with an embodiment of the present invention. The bottom plastic piece has a lateral side 22 wherein a notch recess 28 is positioned. The male guide 24 is inserted in the notch recess 28. The female switch 26 may be clamped onto the male guide 24 to form a write-protect switch. Column 29 positioned approximately in the middle of the recess notch 28 prevents the female switch 26 from sliding from the first write-protect position to the second read/write position by itself.

Figure 3:
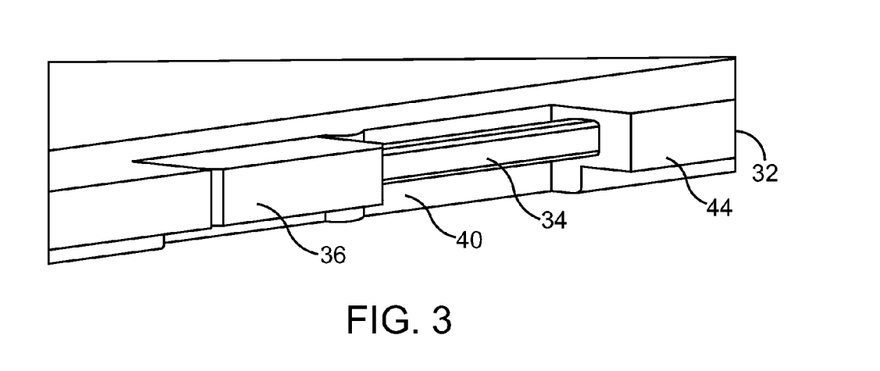
FIG. 3 shows a close up view of the male guide and female switch mechanism, in accordance with an embodiment of the present invention.

Referring now to FIG. 3, a close up view of the male guide and female switch mechanism is shown to include a bottom plastic piece 32, a top cover 46, a lateral side 44 of the bottom plastic piece 32, a notch recess 40, a male guide 34 and a female switch 36, in accordance with an embodiment of the present invention. The female switch 36 is clamped onto the male guide 34 to form the write-protect switch for the molded SD card 10. The female switch 36 is pushed to move from the write-protect position to the read/write position and vice versa.

Figure 4:
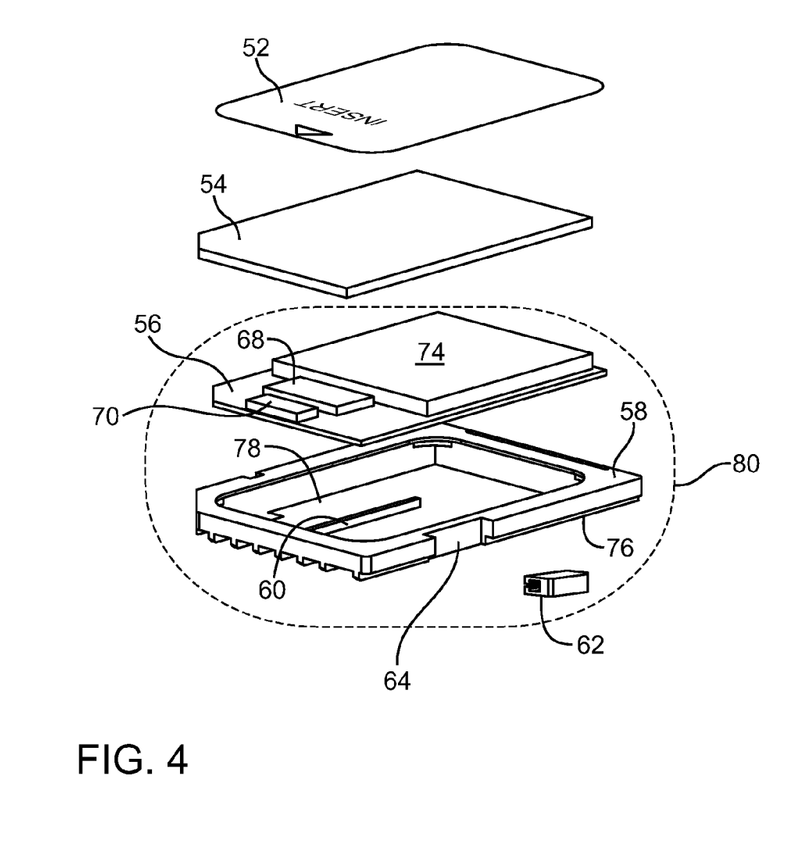
FIG. 4 shows a detailed view of the internal components of a molded SD card 50, in accordance with an embodiment of the present invention.

Referring now to FIG. 4, a detailed view of the internal components of a molded SD card 50 is shown to include a label 52, a top cover 54, a printed circuit board (PCB) assembly 56, a bottom plastic piece 58, a bar 60 and a female switch 62, in accordance with an embodiment of the present invention. The bottom plastic piece 58 is made from plastic and includes a cavity 78 in the middle as well as a plurality of lateral sides one of which, i.e. the lateral side 76, is referred to in FIG. 4.

The bottom plastic piece 58 is molded to form the cavity 78 in the first step of a two-step molding manufacturing process. The cavity 78 has an upper lid which gives a shoe shaped appearance to the bottom plastic piece 58, as described in more detail hereinbelow. The plastic bottom piece 58 is built to Super Talent Technologies (STT) unique designs and conforms to the standard memory card dimension and specifications. In other embodiments of the present invention the cavity 78 has other shapes such as rectangular parallelopiped, cube, etc.

The lateral side 76 of the bottom plastic piece 58 includes the notch recess 64. The bottom plastic piece 58 also includes a bar 60 which functions as the male guide 20 of FIG. 1. Located behind the lateral side 76 and on either end of the notch recess 64 are two slots wherein the bar 60 is dropped such that the middle part of the bar 60 is exposed through the notch recess 64. The bar 60 may be made from metal, ceramic or any other material which can withstand high temperatures of the molding process and other mechanical forces in the manufacturing process.

On the surface of the PCB assembly 56 are mounted all the hardware devices of the molded SD card 50 including the controller 68, the flash memory unit 74 and other discrete components 70 which may include resistors, capacitors, inductors, etc.

After the bar 60 has been installed in the notch recess 64 as described hereinabove, the PCB assembly 56 is positioned in the cavity 78 to form a subassembly 80. The front end of the PCB assembly 56 carrying the controller 68 is first inserted in the cavity 78 and subsequently the back end of the PCB assembly 78 is pressed into the cavity 78 to snug fit therein. The top cover 54 being made form plastic is positioned on top of the subassembly 80 to be placed inside a molding machine for the second step molding process of the 2-step molding manufacturing process.

In other embodiments of the present invention the subassembly 80 is placed inside a molding machine and enough plastic is injected therein to form the top cover 27 (shown in FIG. 2) of the molded SD card 10. The second method is commonly known as injection molding process.

Since the manufacturing process described hereinabove is a 2-step molding process, the glass transition temperature of the plastic material of the second molding step should be higher than the glass transition temperature of the material of the first molding step, which is the bottom plastic piece 58. This insures strong cross-linking between the injected plastic material and the bottom plastic piece 58.

Upon completion of the 2-step molding process, the female switch 62 is clamped on the male guide to form the write-protect switch of the molded SD card 50. The label 52 is then attached to the top surface of the top cover 54 having printed thereon the company logo and other information. Additionally, the label 52 covers the interface between the top cover 54 and the edges of the bottom plastic piece 58 to add a seamless outlook to the molded SD card 50 which is more esthetically appealing.

The PCB assembly 56 has a substrate onto which the flash memory unit 74, the controller 68 and other discrete components 70 are mounted using surface mount technology (SMT). The substrate of the PCB assembly 56 has gold fingers onto which flash memory unit 74, controller 68 and other discrete components 70 are mounted with solder paste to make the PCB assembly 56 into a surface mount technology (SMT) memory module.

Figure 5:
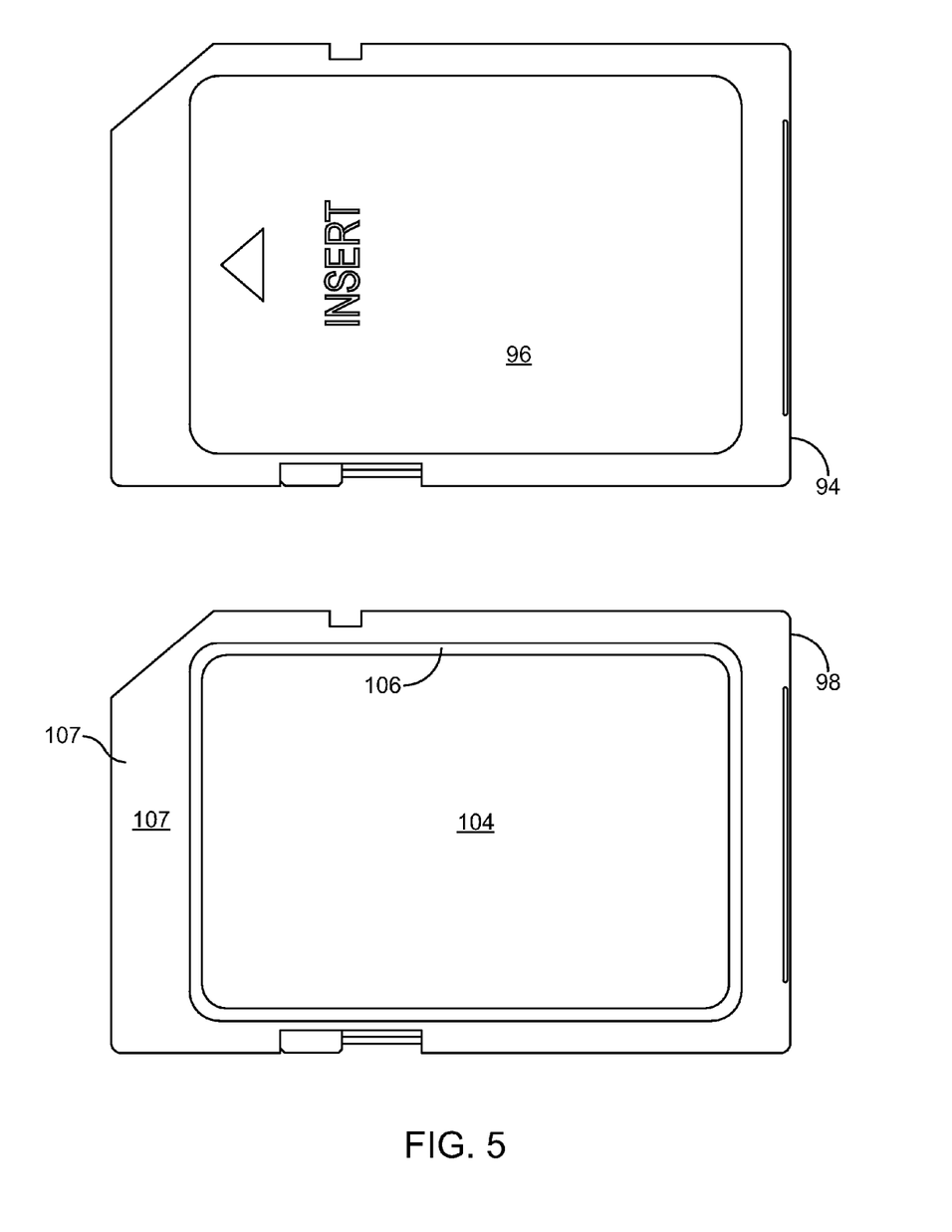
FIG. 5 shows a molded SD card 94 with the label 96 and a molded SD card 98 without a label, in accordance with an embodiment of the present invention.

Referring now to FIG. 5, a molded SD card 94 with the label 96 and a molded SD card 98 without a label are shown, in accordance with an embodiment of the present invention. The label 96 thereon has printed thereon some information and custom design company logo which is attached to the top surface of the top cover 54 of FIG. 4. The label 96 provides a seamless outlook to the molded SD card 94 which is esthetically appealing.

The molded SD card 98 carries no label as a result of which the top surface of the top cover 104 is visible. The plastic bottom piece 98 has a plurality of lateral sides having a top surface 107. The molded SD card 98 also has a step 106. The label is slightly bigger in area than the top surface of the top cover 104 to extend over the step 106 when attached to the top surface of the top cover 104. In this way the interface between the top surface of the top cover 104 and the top surface of the lateral sides of the plastic bottom piece 98 is covered by the label 96 to provide a seamless outlook to the molded SD card. This is shown for the molded SD card 98 where seamless appearance has enhanced the esthetic quality thereof.

Figure 6:
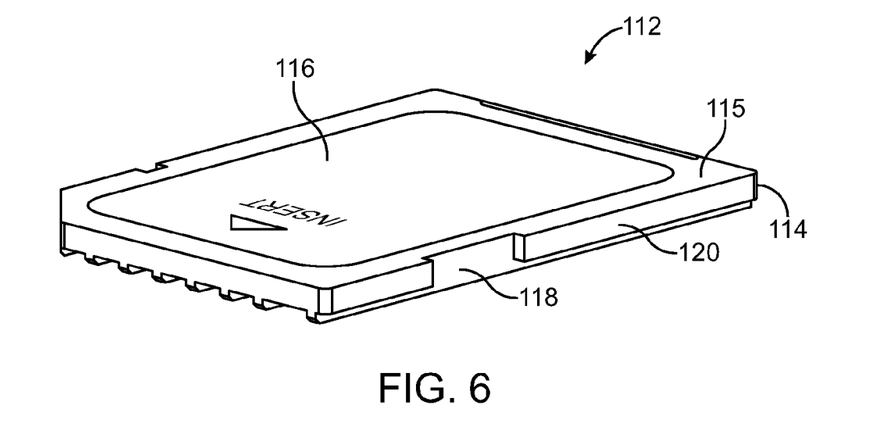
FIG. 6 shows a molded SD card 112, in accordance with an embodiment of the present invention.

Referring now to FIG. 6, an alternative embodiment of the present invention is shown to include the molded SD card 112 including a plastic bottom piece 114 and a label 116. The plastic bottom piece 114 has a plurality of lateral sides one of which is the lateral side 120 having a notch recess 118. The lateral sides have a top surface 115. The notch recess 118 not having a male guide does not provide the molded SD card 112 with a write-protect switch.

However, the label 116 covers the interface between the top surface of the top cover (not shown in FIG. 6) and the top surface 115 of the lateral sides of the bottom plastic piece 114 to render the molded SD card 112 esthetically appealing. The molded SD card 112 undergoes almost the same manufacturing process as the molded SD card 50 described in detail in relation to FIG. 4. The difference lies in the presence of the male guide and female switch in the molded SD card 50 and lack thereof in the molded SD card 112.

Figure 7:
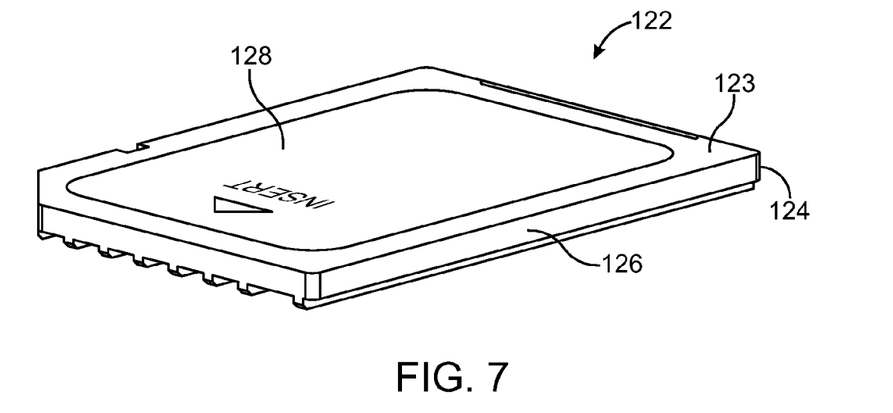
FIG. 7 shows a molded SD card 122, in accordance with an embodiment of the present invention.

Referring now to FIG. 7, an alternative embodiment of the present invention is shown to include a molded SD card 122 including a bottom plastic piece 124 and a label 128. The bottom plastic piece 124 has a plurality of lateral sides having a top surface 123. The molded SD card 122 does not have a write-protect switch, however, the label 128 covers the interface between the top surface of the top cover (not shown in FIG. 7) and the top surface 123 of the lateral sides of the bottom plastic piece 114 to render the molded SD card 122 esthetically appealing.

The molded SD card 122 undergoes almost the same manufacturing process as the molded SD card 112 described in relation to FIG. 6. The difference is in the presence of a notch recess in the molded SD card 112 and lack thereof in FIG. 7.

Figure 8A:
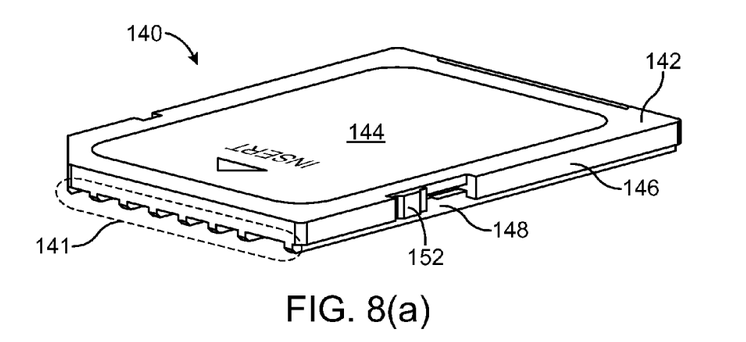
FIG. 8(a) shows a molded SD card 140, in accordance with an embodiment of the present invention.
Figure 8B:
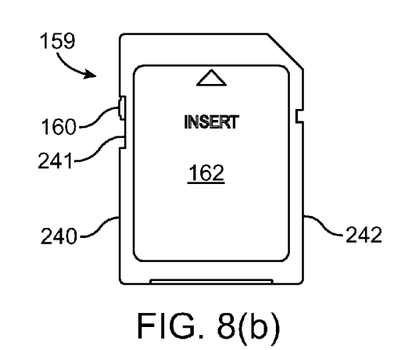
FIG. 8(b) shows a top view 159 of the molded SD card 140, in accordance with an embodiment of the present invention.
Figure 8C:
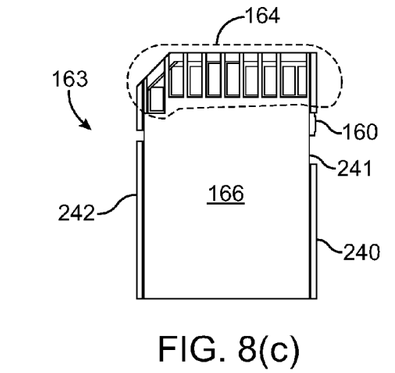
FIG. 8(c) shows a bottom view 163 of the molded SD card 140, in accordance with an embodiment of the present invention.
Figure 8D:
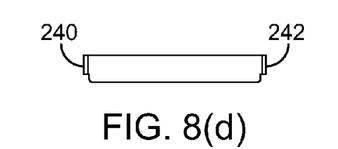
FIG. 8(d) shows a cross section of the top view 159 of the molded SD card 140, in accordance with an embodiment of the present invention.
Figure 8E:
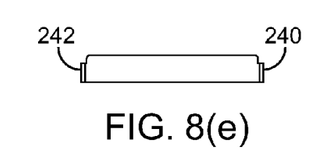
FIG. 8(e) shows a cross section of the bottom view 163 of the molded SD card 140, in accordance with an embodiment of the present invention.
Figure 8F:
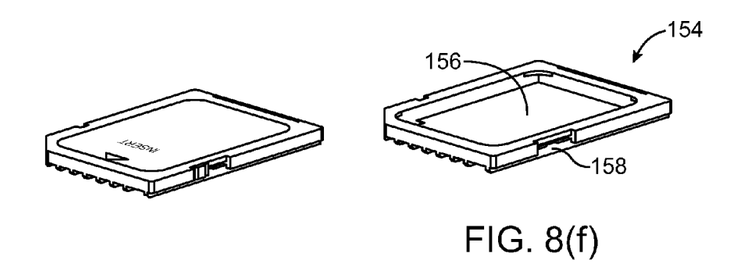
FIG. 8(f) shows a plastic bottom piece 154, in accordance with an embodiment of the present invention.

Referring now to FIG. 8(a), a molded SD card 140 is shown to include a bottom plastic piece 142, a label 144, a female slot 148, a male switch 152 and a 9-pin interface connector 141, in accordance with an embodiment of the present invention. The bottom plastic piece 142 has a plurality of lateral sides one of which is labeled as 146. The female slot 148 is built into the lateral side 146 and the male switch 152 is positioned inside the female slot 148.

The label 144 covers the interface between the top surface of the top cover and the top surface of the lateral sides of the bottom plastic piece 142 to render the molded SD card 140 seamless and esthetically appealing. In addition, seamless design of the molded SD card 140 enhances moisture resistance and waterproof quality to protect the electronic components therein.

The male switch 152 functions as a write-protect switch. Positioning the male switch 152 adjacent to one end of the female slot 148 prevents writing (write-protect position) while positioning the male switch 152 adjacent to other end of the female slot 148 allows reading from and writing to (read/write position) the molded SD card 140. The male switch 152 is moved from one position to the other to function as a write-protect switch.

The female switch 152 is built on the lateral side 146 of the bottom plastic piece 142. Specifically, the shape and size of the female slot 148 is built on the plastic mold. Upon completion of the injection molding process the female slot 148 is formed on the lateral side 146 of the bottom plastic piece 142. The male switch 152 is built separately to the appropriate shape and size to mate with the female slot 148 by being pressed therein.

The 9-pin interface connector 141 couples the molded SD card 140 to a host device for transfer of data therebetween.

FIG. 8(*b*) shows a top view 159 of the molded SD card 140 including the label 162, two lateral sides 240 and 242, the female slot 241 and the male switch 160, in accordance with an embodiment of the present invention. The custom designed company logo and other information is indicated on the label 162. The female slot 241 and male guide 160 are positioned on the lateral side 240.

FIG. 8(*c*) shows a bottom view 163 of the molded SD card 140 including the bottom surface of the bottom plastic piece 166, the 9-pin interface connector 164 and the two lateral sides 240 and 242, in accordance with an embodiment of the present invention. The 9-pin interface connector 164 couples the molded SD card 140 to a host device for transfer of data therebetween. The electronic devices in the PCB assembly 56 are coupled to the 9-pin interface connector 164. In other embodiments of the present invention the interface connector 164 has a plurality of pins. Also shown in FIG. 8(*c*) is the male switch 160.

FIG. 8(*d*) shows a cross section of the top view 159 of the molded SD card 140 to include the lateral sides 240 and 242, in accordance with an embodiment of the present invention. FIG. 8(*e*) shows a cross section of the bottom view 163 of the molded SD card 140 to include the lateral sides 240 and 242, in accordance with an embodiment of the present invention.

Referring now to FIG. 8(*f*), a plastic bottom piece 154 is shown to include a cavity 156 and a female slot 158, in accordance with an embodiment of the present invention. The molded cavity 156 gives a shoe shaped appearance to the bottom plastic piece 154. In the molding operation the female switch 158 is formed on the outer side of one of the plurality of lateral sides of the bottom plastic piece 154.

Referring now to FIG. 9(*a*), a molded SD card 172 with side ribs is shown to include a bottom plastic piece 174, a label 173, a 9-pin interface connector 256 and side ribs 176, in accordance with an embodiment of the present invention. The presence of side ribs 176 on lateral sides of the bottom plastic piece 174 reduces slippage and enhances the esthetic quality thereof. The side ribs may be located on one or more of the lateral side of the bottom plastic piece. In FIG. 9(*a*) there is another set of side ribs on the lateral side opposite to the lateral side having the side ribs 176. The 9-pin interface connector 256 couples the molded SD card 172 to a host device for transfer of data therebetween.

Figure 9A:
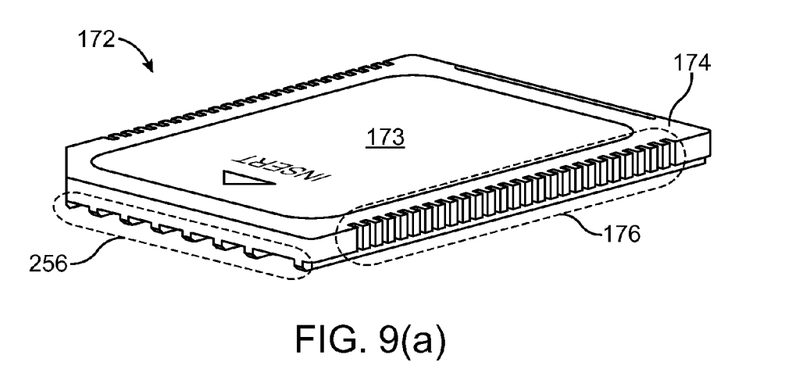
FIG. 9(a) shows a molded SD card 172 with side ribs, in accordance with an embodiment of the present invention.
Figure 9B:
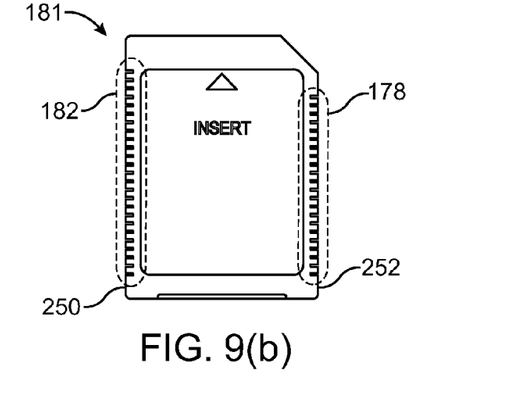
FIG. 9(b) shows a top view 181 of the molded SD card 172, in accordance with an embodiment of the present invention.
Figure 9C:
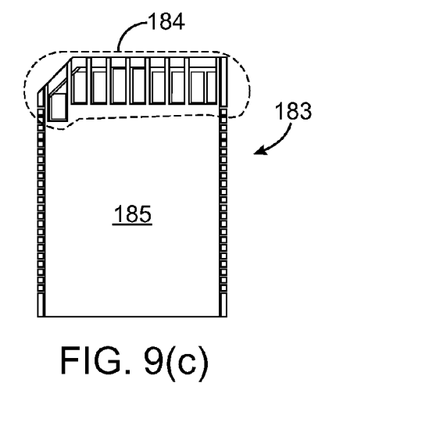
FIG. 9(c) shows a bottom view 183 of the molded SD card 172, in accordance with an embodiment of the present invention.
Figure 9D:
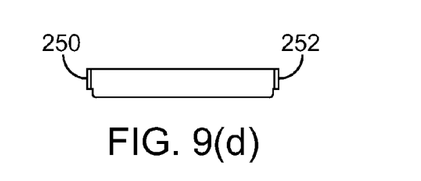
FIG. 9(d) shows a cross section of the top view 181 to include the lateral sides 250 and 252, in accordance with an embodiment of the present invention.
Figure 9E:
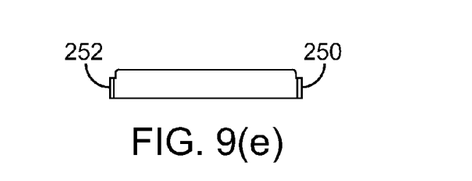
FIG. 9(e) shows a cross section of the bottom view 183 to include the lateral sides 250 and 252, in accordance with an embodiment of the present invention.
Figure 9F:
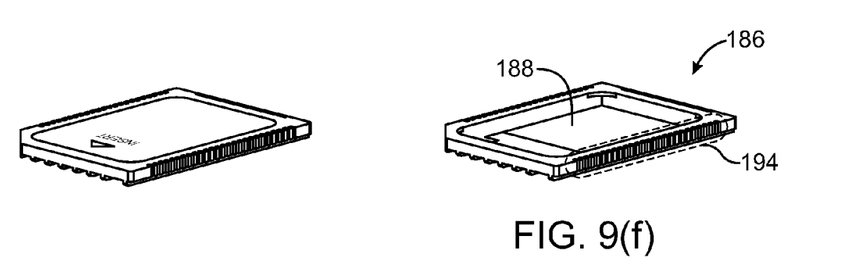
FIG. 9(f) shows a bottom plastic piece 186 of the molded SD card 172 to include a cavity 188 and side ribs 194, in accordance with an embodiment of the present invention.

The label 173 provides seamless design appearance to the molded SD card 172 to enhance esthetic value thereof. The label 173 also enhances moisture resistance and water resistance of the molded SD card 172 to protect internal electronic components therein. The molded SD card 172 has no female slot and therefore has no write-protect switch.

Referring now to FIG. 9(*b*), a top view 181 of the molded SD card 172 is shown to include two lateral sides 250 and 252 and two sets of side ribs 182 and 178, in accordance with an embodiment of the present invention. The side ribs 182 and 178 are formed on the outer sides of the lateral sides 250 and 252, respectively, in a molding process. The side ribs 182 and 178 reduce slippage and enhance esthetic quality of the molded SD card 172.

Referring now to FIG. 9(*c*), a bottom view 183 of the molded SD card 172 is shown to include the bottom surface of the bottom plastic piece 185 and a 9-pin interface connector 184, in accordance with an embodiment of the present invention. The 9-pin interface connector 184 couples the molded SD card 172 to a host device for transfer of data therebetween.

FIG. 9(*d*) shows a cross section of the top view 181 to include the lateral sides 250 and 252, in accordance with an embodiment of the present invention. FIG. 9(*e*) shows a cross section of the bottom view 183 to include the lateral sides 250 and 252, in accordance with an embodiment of the present invention.

Referring now to FIG. 9(*f*), a bottom plastic piece 186 of the molded SD card 172 is shown to include a cavity 188 and side ribs 194, in accordance with an embodiment of the present invention. The side ribs 194 are formed in the molding process on the lateral side of the bottom plastic piece 194. The cavity 188 gives a shoe shaped appearance to the bottom plastic piece 186.

Referring now to FIG. 10(*a*), a molded shark head SD card 200 with side ribs is shown to include a label 202, a bottom plastic piece 203, a set of side ribs 204 and a 9-pin interface connector 260, in accordance with an embodiment of the present invention. The bottom plastic piece 203 has a plurality of lateral sides two of which include side ribs. Specifically, the set of side ribs 204 partially covers the outer part of the lateral side shown in FIG. 10(*a*). The same lateral side has a plain outer part 208 without side ribs. The presence of plain outer part on the opposite lateral side of the bottom plastic piece 203 gives a shark head appearance to the molded SD card 200. The 9-pin interface connector 260 couples the molded SD card 200 to a host device for transfer of data therebetween.

Figure 10A:
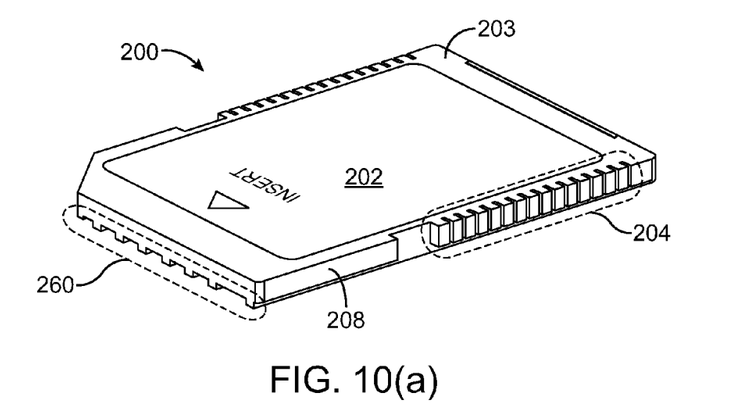
FIG. 10(a) shows a molded shark head SD card 200 with side ribs, in accordance with an embodiment of the present invention.
Figure 10B:
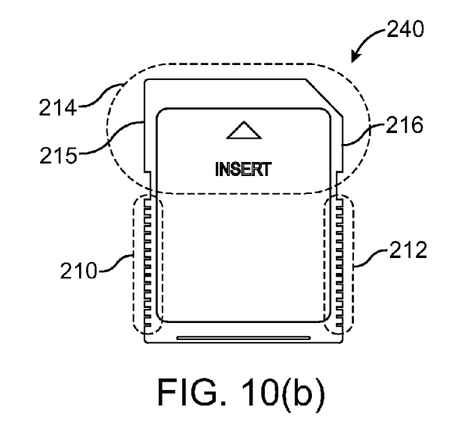
FIG. 10(b) shows a top view of the molded SD card 200 to include a shark head front part 214 and two sets of side ribs 210 and 212, in accordance with an embodiment of the present invention.

The presence of side ribs 204 and a similar set on the opposite lateral side reduces possibility of slippage and enhances esthetic quality of the molded SD card 200. The molded SD card 200 has no write-protect switch.

The label 202 provides seamless design appearance to the molded SD card 202 to enhance esthetic value thereof. The label 202 also provides higher moisture and water resistance to protect internal electronic components of the molded SD card 200.

Referring now to FIG. 10(*b*), a top view of the molded SD card 200 is shown to include a shark head front part 214 and two sets of side ribs 210 and 212, in accordance with an embodiment of the present invention. The lateral sides that include the sets of side ribs 210 and 212 also include plain parts 215 and 216, respectively. The presence of plain parts 215 and 216 gives a shark head appearance to the front part 214 of the molded SD card 200. In the embodiments of the present invention the side ribs 210 and 212 are positioned anywhere on the outer part of the lateral sides including the front part 214.

Figure 10C:
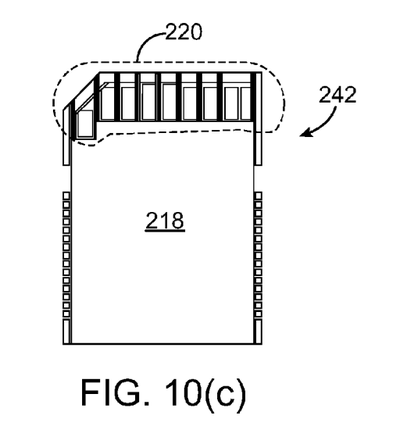
FIG. 10(c) shows a bottom view 242 of the molded SD card 200, in accordance with an embodiment of the present invention.

Referring now to FIG. 10(c), a bottom view 242 of the molded SD card 200 is shown to include the bottom surface of the bottom plastic piece 218 and a 9-pin interface connector 220, in accordance with an embodiment of the present invention. The 9-pin interface connector 220 couples the molded SD card 200 to a host device for transfer of data therebetween.

Figure 10D:
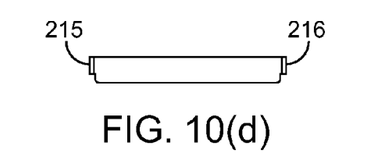
FIG. 10(d) shows a cross section of the top view 240 of the molded SD card 200 to include the lateral sides 215 and 216, in accordance with an embodiment of the present invention.
Figure 10E:
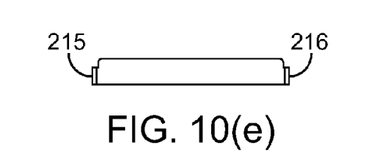
FIG. 10(e) shows a cross section of the bottom view 242 of the molded SD card 200 to include two lateral sides 215 and 216, in accordance with an embodiment of the present invention.

FIG. 10(d) shows a cross section of the top view 240 of the molded SD card 200 to include the lateral sides 215 and 216, in accordance with an embodiment of the present invention. FIG. 10(e) shows a cross section of the bottom view 242 of the molded SD card 200 to include two lateral sides 215 and 216, in accordance with an embodiment of the present invention.

Figure 10F:
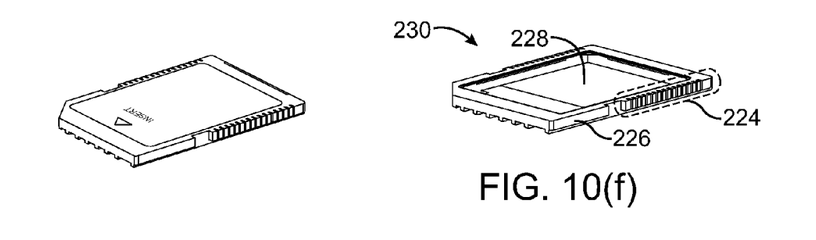
FIG. 10(f) shows the bottom plastic piece 230 of the molded SD card 200 to include a cavity 228, a set of side ribs 224 and a plain part 226 of a lateral side of the bottom plastic piece 230, in accordance with an embodiment of the present invention.

Referring now to FIG. 10(f), the bottom plastic piece 230 of the molded SD card 200 is shown to include a cavity 228, a set of side ribs 224 and a plain part 226 of a lateral side of the bottom plastic piece 230, in accordance with an embodiment of the present invention.

Figure 11A:
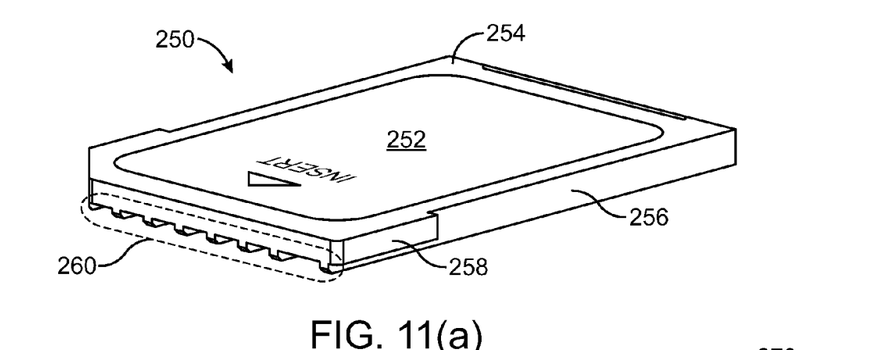
FIG. 11(a) shows a molded SD card 250 with shark head is include a bottom plastic piece 254, a label 252 and a 9-pin interface connector 260, in accordance with an embodiment of the present invention.

Referring now to FIG. 11(a), a molded SD card 250 with shark head is shown to include a bottom plastic piece 254, a label 252 and a 9-pin interface connector 260, in accordance with an embodiment of the present invention. The bottom plastic piece 254 has a plurality of lateral sides one of which is referred to as the lateral side 256. The lateral side 256 has a protruded part 258 which together with a similar part on the opposite lateral side gives a shark head appearance to the molded SD card 250. The 9-pin interface connector 260 couples the molded SD card 250 to a host device for transfer of data therebetween.

The label 252 provides seamless design appearance to the molded SD card 250 to enhance esthetic quality thereof. The label 252 also provides higher moisture and water resistance to protect internal components of the molded SD card 250.

Figure 11B:
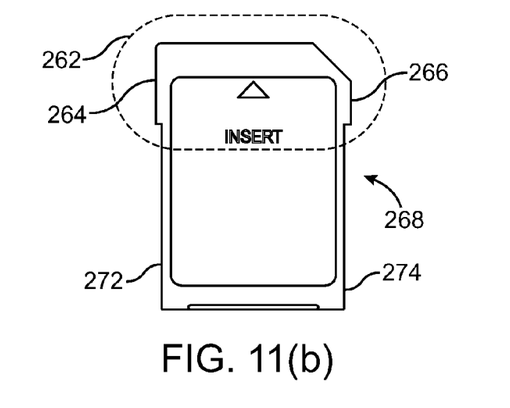
FIG. 11(b) shows a top view 268 of the molded SD card 250 to include two lateral sides 272 and 274 and a front part 262, in accordance with an embodiment of the present invention.

Referring now to FIG. 11(b), a top view 268 of the molded SD card 250 is shown to include two lateral sides 272 and 274 and a front part 262, in accordance with an embodiment of the present invention. The lateral sides 272 and 274 include protruded parts 264 and 266, respectively, which give the molded SD card 268 a shark head appearance.

Figure 11C:
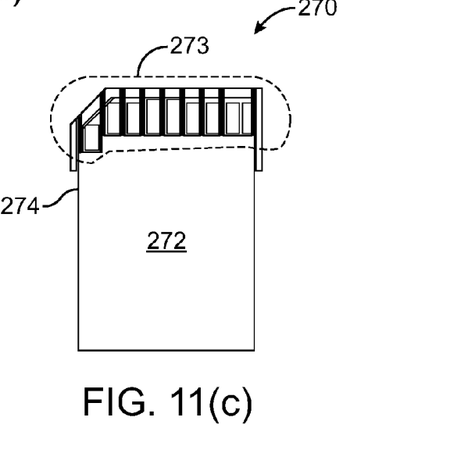
FIG. 11(c) shows a bottom view 270 of the molded SD card 250 to include the bottom surface 272 of the bottom plastic piece 254, a 9-pin interface connector 273 and two lateral sides 272 and 274, in accordance with an embodiment of the present invention.

Referring now to FIG. 11(c), a bottom view 270 of the molded SD card 250 is shown to include the bottom surface 272 of the bottom plastic piece 254, a 9-pin interface connector 273 and two lateral sides 272 and 274, in accordance with an embodiment of the present invention. The 9-pin interface connector 273 couples the molded SD card 250 to a host device for transfer of data therebetween.

Figure 11D:
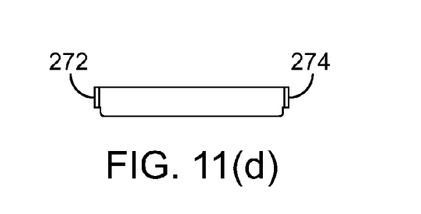
FIG. 11(d) shows a cross section of the top view 268 of the molded SD card 250 to include two lateral sides 272 and 274, in accordance with an embodiment of the present invention.
Figure 11E:
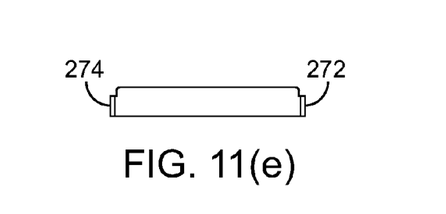
FIG. 11(e) shows a cross section of the bottom view 270 of the molded SD card 250 to include the lateral sides 272 and 274, in accordance with an embodiment of the present invention.

FIG. 11(d) shows a cross section of the top view 268 of the molded SD card 250 to include two lateral sides 272 and 274, in accordance with an embodiment of the present invention. FIG. 11(e) shows a cross section of the bottom view 270 of the molded SD card 250 to include the lateral sides 272 and 274, in accordance with an embodiment of the present invention.

Figure 11F:
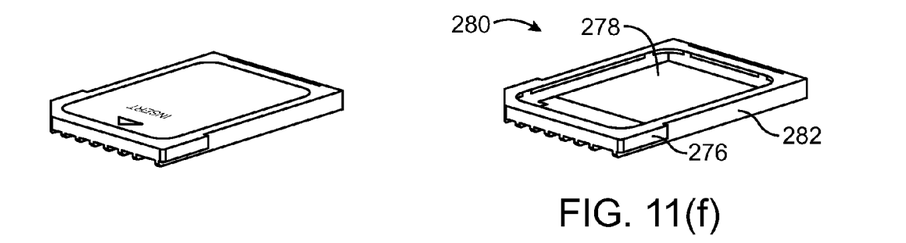
FIG. 11(f) shows the bottom plastic piece 280 of the molded SD card 250 to include a cavity 278 and a lateral side 282, in accordance with an embodiment of the present invention.

Referring now to FIG. 11(f), the bottom plastic piece 280 of the molded SD card 250 is shown to include a cavity 278 and a lateral side 282, in accordance with an embodiment of the present invention. The lateral side includes a protruded part 276 which along with a similar protruded part on the opposite lateral side gives a shark head appearance to the molded SD card 250. In other embodiments of the present invention the plurality of lateral sides includes one or more protruded parts.

Figure 12A:
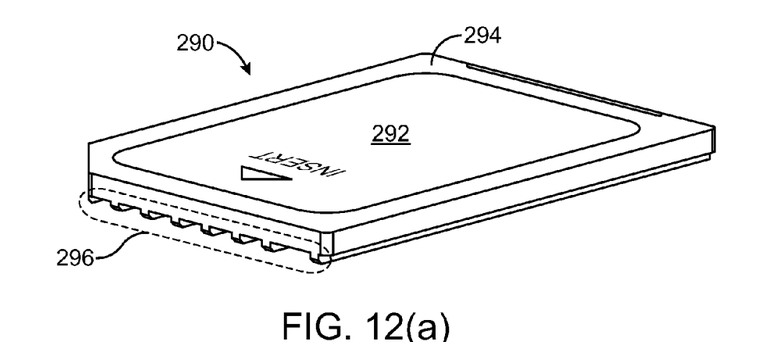
FIG. 12(a) shows a molded SD card 290 to include a bottom plastic piece 294, a label 292 and a 9-pin interface connector 296, in accordance with an embodiment of the present invention.

Referring now to FIG. 12(a), a molded SD card 290 is shown to include a bottom plastic piece 294, a label 292 and a 9-pin interface connector 296, in accordance with an embodiment of the present invention. The label 292 provides seamless design appearance to the molded SD card 290 to enhance esthetic value thereof. The label 292 also provides higher moisture and water resistance to protect internal components of the molded SD card 290.

The 9-pin interface connector 296 couples the molded SD card 290 to a host device for transfer of data therebetween.

Figure 12B:
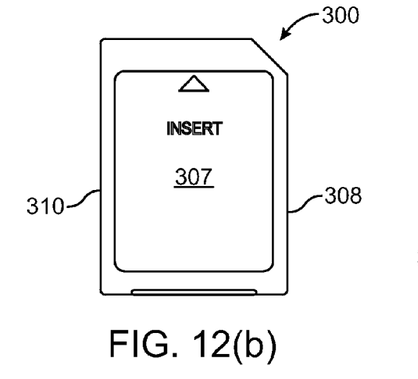
FIG. 12(b) shows a top view 300 of the molded SD card 290 to include two lateral sides 310 and 308, in accordance with an embodiment of the present invention.

Referring now to FIG. 12(b), a top view 300 of the molded SD card 290 is shown to include two lateral sides 310 and 308, in accordance with an embodiment of the present invention. Also shown in FIG. 12(b) is the label 307 attached to the top surface of the molded SD card 290.

Figure 12C:
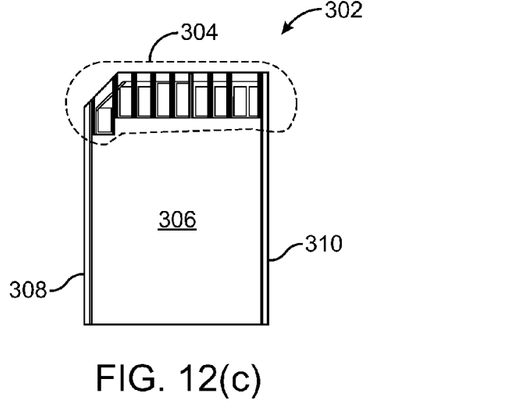
FIG. 12(c) shows a bottom view 302 of the molded SD card 290 to include the bottom surface 306 of the bottom plastic piece 294, a 9-pin interface connector 304 and two lateral sides 308 and 310, in accordance with an embodiment of the present invention.

Referring now to FIG. 12(c), a bottom view 302 of the molded SD card 290 is shown to include the bottom surface 306 of the bottom plastic piece 294, a 9-pin interface connector 304 and two lateral sides 308 and 310, in accordance with an embodiment of the present invention.

Figure 12D:
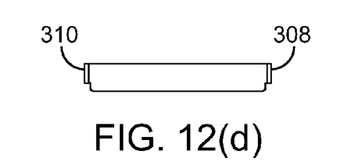
FIG. 12(d) shows a cross section of the top view 300 of the molded SD card 290 to include two lateral sides 308 and 310, in accordance with an embodiment of the present invention.
Figure 12E:
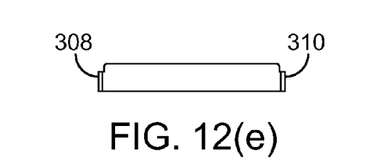
FIG. 12(e) shows a cross section of the bottom view 302 of the molded SD card 290 to include the lateral sides 308 and 310, in accordance with an embodiment of the present invention.

FIG. 12(d) shows a cross section of the top view 300 of the molded SD card 290 to include two lateral sides 308 and 310, in accordance with an embodiment of the present invention. FIG. 12(e) shows a cross section of the bottom view 302 of the molded SD card 290 to include the lateral sides 308 and 310, in accordance with an embodiment of the present invention.

Figure 12F:
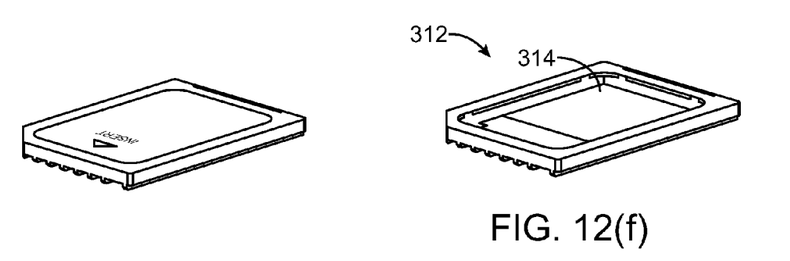
FIG. 12(f) shows the bottom plastic piece 312 of the molded SD card 290 to include the cavity 314, in accordance with an embodiment of the present invention.

Referring now to FIG. 12(f), the bottom plastic piece 312 of the molded SD card 290 is shown to include the cavity 314, in accordance with an embodiment of the present invention. The presence of the cavity 314 gives a shoe shaped appearance to the bottom plastic piece 312, in accordance with an embodiment of the present invention.

Figure 13:
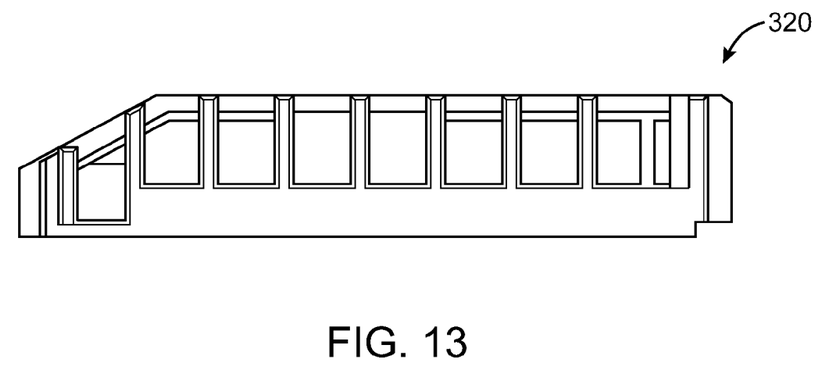
FIG. 13 shows a 9-pin interface connector 320, in accordance with an embodiment of the present invention.

Referring now to FIG. 13, a 9-pin interface connector 320 is shown, in accordance with an embodiment of the present invention. The interface connector 320 couples the molded SD card to a host device through use of a wide range of protocols presented in the U.S. Patent Publication No. US2005/0197017 A1, publication date Sep. 8, 2005 entitled "EXTENDED SECURED-DIGITAL (SD) DEVICES AND HOSTS" disclosure of which is herein incorporated by reference as though set in full. Examples of protocols used to couple the molded Secured Digital (SD) card with a host device through the interface connector 320 include multi media card (MMC), serial peripheral interface (SPI), Secured Digital (SD), Enhanced multi media card (EMMC), Universal Serial Bus (USB), extended Universal Serial Bus (EUSB), peripheral component interconnect express (PCIE) card, serial advanced technology attachment (SATA) drive and 1394 Fire Wire. In other embodiments of the present invention the interface connector 320 has a plurality of pins.

Figure 14A:
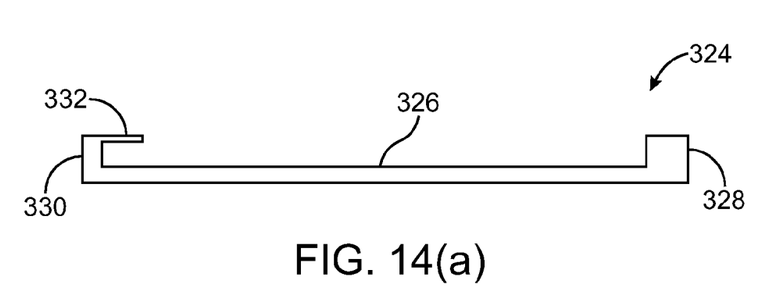
FIG. 14(a) shows a plastic bottom piece 324 to include a cavity 326, two lateral sides 328 and 330 and an upper lid 332, in accordance with an embodiment of the present invention.

Referring now to FIG. 14(a), a plastic bottom piece 324 is shown to include a cavity 326, two lateral sides 328 and 330 and an upper lid 332, in accordance with an embodiment of the present invention. The presence of the upper lid 332 gives a shoe shaped appearance to the plastic bottom piece 324 and helps keep the PCB assembly inside the plastic bottom piece 324 as described in detail hereinbelow.

Figure 14B:
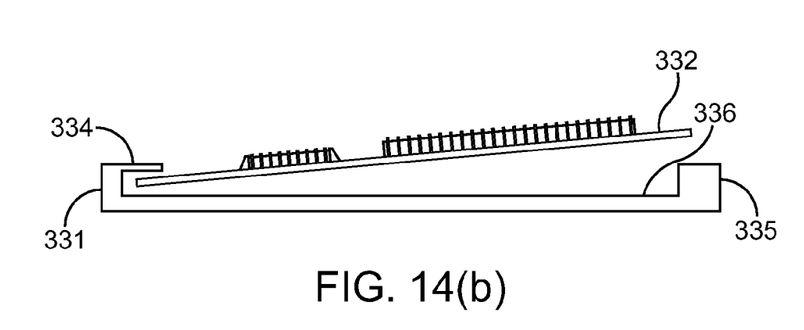
FIG. 14(b) shows a printed circuit board (PCB) assembly 332 to be positioned inside the cavity 336 of a plastic bottom piece, in accordance with an embodiment of the present invention.

Referring now to FIG. 14(b), a PCB assembly 332 is shown to be positioned inside the cavity 336 of a plastic bottom piece, in accordance with an embodiment of the present invention. One end of the PCB assembly 332 is inserted at an angle under the upper lid 334 until the inserted edge of the PCB assembly 332 comes in contact with the inner wall of the lateral side 331. The other end of the PCB assembly 332 is then lowered into the cavity 336 so that the end thereof comes in contact with the inner wall of the lateral side 335. The PCB assembly 332 is then pressed into the cavity 336 to fit snugly therein.

Figure 14C:
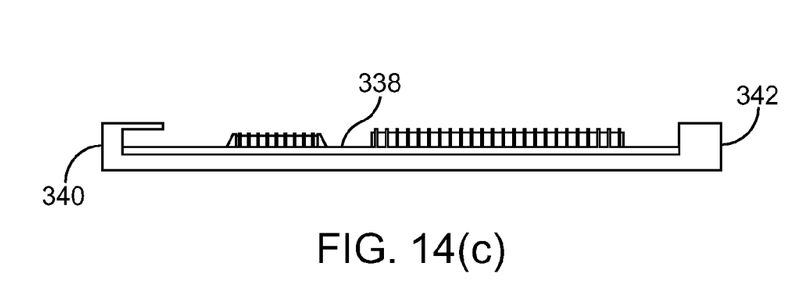
FIG. 14(c) shows a PCB assembly 338 to have been inserted in a plastic bottom piece having the lateral sides 340 and 342, in accordance with an embodiment of the present invention.

Referring now to FIG. 14(c) a PCB assembly 338 is shown to have been inserted in a plastic bottom piece having the lateral sides 340 and 342, in accordance with an embodiment of the present invention. The lateral sides 340 and 342 maintain the PCB assembly 338 inside the cavity of the plastic bottom piece.

Although the present invention has been described in terms of specific embodiment, it is anticipated that alterations and modifications thereof will no doubt become apparent to those more skilled in the art. It is therefore intended that the following claims be interpreted as covering all such alterations and modification as fall within the true spirit and scope of the invention.

What is claimed is:

1. A molded secured digital (SD) card comprising:
   a bottom plastic piece having a plurality of lateral sides, said bottom plastic piece further having a cavity interposed along said plurality of lateral sides; and
   a printed circuit board (PCB) assembly positioned in said cavity, one of said plurality of lateral sides of said bottom plastic piece having a notch recess, said molded SD card further having a male guide insertably positioned into said notch recess, said molded SD card further having a female switch clamped onto said male guide to form a write-protect switch.

2. A molded secured digital (SD) card as recited in claim 1 wherein said bottom plastic piece molded to form said cavity, one of said lateral sides of said bottom plastic piece having an upper lid, one end of said printed circuit board (PCB) assembly inserted under said upper lid to position said PCB assembly inside said cavity, said upper lid giving said bottom plastic piece a shoe shaped appearance, said cavity made to conform to Super Talent Technologies (STT) unique designs and standard memory card dimension and specification.

3. A molded secured digital (SD) card as recited in claim 2 wherein said notch recess formed on one of said plurality of lateral sides in a molding process to have said female switch insertably positioned therein, said printed circuit board (PCB) assembly fitted into said cavity to form a subassembly.

4. A molded secured digital (SD) card as recited in claim 3 further having a top cover positioned on top of said subassembly, said subassembly and said top cover being molded to cross link said bottom plastic piece with said printed circuit board (PCB) assembly, said subassembly and said top cover molded at a substantially high glass transition temperature for cross linking said bottom plastic piece and the molding plastic material.

5. A molded secured digital (SD) card as recited in claim 3 wherein said subassembly being placed in a molding machine for plastic to be injected in said molding machine to form a top cover, said subassembly molded at a substantially high glass transition temperature to develop cross linking between said bottom plastic piece and the molding plastic material.

6. A molded secured digital (SD) card as recited in claim 4 wherein a plurality of devices being disposed on the surface of said printed circuit board (PCB) assembly, said plurality of devices including a flash memory unit and a controller, said plurality of devices further including discrete components, said flash memory unit storing information in said molded SD card.

7. A molded secured digital (SD) card as recited in claim 6 wherein said male guide being a bar, said female switch sliding over said male guide to acquire two positions the first of which for allowing information to be written unto said memory unit of said molded SD card and the second of said positions for preventing information to be written unto said memory unit.

8. A molded secured digital (SD) card as recited in claim 6 wherein said top surface of said top cover making an interface with the top surface of said plurality of lateral sides, said molded SD card further having a label attached to the top surface of said top cover to cover said interface for enhancing the esthetic quality of said molded SD card.

9. A molded secured digital (SD) card comprising:
   a bottom plastic piece having a plurality of lateral sides, said bottom plastic piece further having a cavity interposed along said plurality of lateral sides; and
   a printed circuit board (PCB) assembly positioned inside said cavity, one of said plurality of lateral sides of said bottom plastic piece having a female slot, said molded SD card further having a male switch insertably positioned into said female slot to form a write-protect switch.

10. A molded secured digital (SD) card as recited in claim 9 wherein said female slot formed on one of said plurality of lateral sides in a molding process, said printed circuit board (PCB) assembly fitted into said cavity to form a subassembly.

11. A molded secured digital (SD) card comprising:
    a bottom plastic piece having a plurality of lateral sides, said bottom plastic piece further having a cavity interposed along said plurality of lateral sides; and
    a printed circuit bard (PCB) assembly positioned inside said cavity, said molded SD card further including a top cover having a top surface, said top cover positioned on top of said PCB assembly, said top surface of said top cover making an interface with the top surface of said plurality of lateral sides, said molded SD card further having a label attached to said top surface of said top cover to cover said interface for enhancing the esthetic value of said molded SD card.

12. A molded secured digital (SD) card as recited in claim 11 wherein one or more said plurality of lateral sides having side ribs formed in a molding process, said side ribs for reducing slippage and enhancing esthetic value of said molded SD card.

13. A molded secured digital (SD) card as recited in claim 11 wherein one or more of said plurality of lateral sides having protruded parts to give a shark head appearance to said molded SD card.

14. A molded secured digital (SD) card as recited in claim 8 wherein said label being attached to said top surface of said top cover to protect said plurality of devices by enhancing moisture and water resistance of said molded SD card.

15. A molded secured digital (SD)card as recited in claim 11 wherein a plurality of devices being disposed on the surface of said printed circuit board (PCB) assembly, said plurality of devices including a flash memory unit and a controller, said plurality of devices further including discrete components, said flash memory unit storing information in said molded SD card.

16. A molded secured digital (SD) card as recited in claim 15 wherein said label being attached to said top surface of said top cover to protect said plurality of devices by enhancing moisture and water resistance of said molded SD card.

17. A molded secured digital (SD) card comprising:
    means for forming a cavity interposed along a plurality of lateral sides of a bottom plastic piece by a molding process;
    means for positioning a printed circuit board (PCB) assembly inside the cavity;
    means for positioning a top cover having a top surface on top of the PCB assembly; and
    means for attaching a label to the top surface of the top cover to cover the interface between the top surface of the top cover and the top surface of the plurality of lateral sides.

* * * * *